(12) United States Patent
Park et al.

(10) Patent No.: US 7,548,139 B2
(45) Date of Patent: Jun. 16, 2009

(54) COUPLED RESONATOR FILTER AND FABRICATION METHOD THEREOF

(75) Inventors: Hao-seok Park, Yongin-si (KR); Joo-ho Lee, Seoul (KR); Byeoung-ju Ha, Seongnam-si (KR); Seog-woo Hong, Yongin-si (KR); Hyung Choi, Seongnam-si (KR); In-sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 297 days.

(21) Appl. No.: 11/455,190

(22) Filed: Jun. 19, 2006

(65) Prior Publication Data
US 2007/0139139 A1 Jun. 21, 2007

(30) Foreign Application Priority Data
Dec. 19, 2005 (KR) .................. 10-2005-0125525

(51) Int. Cl.
*H03H 9/17* (2006.01)
*H03H 9/00* (2006.01)
(52) U.S. Cl. ...................... 333/187; 333/189
(58) Field of Classification Search .......... 333/133, 333/187, 189, 191; 310/334
See application file for complete search history.

(56) References Cited

U.S. PATENT DOCUMENTS

| 6,670,866 | B2 | 12/2003 | Ellä et al. |
| 7,053,730 | B2 * | 5/2006 | Park et al. ............. 333/133 |
| 7,233,218 | B2 * | 6/2007 | Park et al. ............. 333/133 |
| 2006/0202769 | A1 * | 9/2006 | Nagao et al. ............ 331/73 |

FOREIGN PATENT DOCUMENTS

JP 2002-271897 A 9/2002

* cited by examiner

*Primary Examiner*—Daniel D Chang
(74) *Attorney, Agent, or Firm*—Sughrue Mion, PLLC

(57) ABSTRACT

A coupled resonator filter and a method of fabricating the coupled resonator filter are provided. The method includes: sequentially stacking a first electrode, a first piezoelectric layer, a second electrode, an insulating layer, a third electrode, a second piezoelectric layer, and a fourth electrode on a surface of a substrate; sequentially patterning the first electrode, the first piezoelectric layer, the second electrode, the insulating layer, the third electrode, the second piezoelectric layer, and the fourth electrode to expose areas of the first, second, and third electrodes; forming a plurality of connection electrodes respectively connected to the exposed areas of the first, second, and third electrodes and an area of the fourth electrode; and etching an area of the substrate underneath the first electrode to form an air gap.

16 Claims, 6 Drawing Sheets

COUPLED RESONATOR FILTER AND FABRICATION METHOD THEREOF

CROSS-REFERENCE TO RELATED APPLICATIONS

This application claims priority from Korean Patent Application No. 10-2005-0125525, filed on Dec. 19, 2005, in the Korean Intellectual Property Office, the disclosure of which is incorporated herein by reference.

BACKGROUND OF THE INVENTION

1. Field of the Invention

Apparatuses and methods consistent with the present invention relate to a coupled resonator filter and a fabrication method thereof, and more particularly, to a coupled resonator filter on which a plurality of materials are sequentially stacked and patterned to sequentially stack a first electrode, a first piezoelectric layer, a second electrode, an insulating layer, a third electrode, a second piezoelectric layer, and a fourth electrode, and a fabrication method thereof.

2. Description of the Related Art

Demands for compact, light filters used in mobile communication devices represented by portable phones have been rapidly increased with the rapid popularization of the mobile communication devices. Film bulk acoustic resonators (FBARs) have been known as powerful members for constituting such compact, light filters. FBARs can be produced at a minimum cost and realized as being compact. The FBARs can realize a high quality factor Q as a major characteristic of filters and be used in a micro-frequency band.

In general, an FBAR has a structure in which a first electrode, a piezoelectric layer, and a second electrode are sequentially stacked. To operate the FBAR, electric energy is applied to the first and second electrodes to induce an electric field inside the piezoelectric layer and produce a piezoelectric phenomenon in the piezoelectric layer due to the electric field so as to generate a bulk acoustic wave. As a result, a resonance is produced.

A plurality of FBARs are combined into a ladder type or lattice type filter so as to be used as a filter. However, the ladder type or lattice type filter cannot perform a transformation operation between an unbalanced signal and a balanced signal. Thus, the ladder type or lattice type filter must further include a balun structure to perform the transformation operation.

To solve this problem, there has been developed a coupled resonator filter which is capable of outputting both a balanced signal and an unbalanced signal when an unbalanced signal is input. The coupled resonator filter is basically fabricated by vertically stacking two FBARs.

U.S. Pat. No. 6,670,866 discloses a coupled resonator filter. The disclosed coupled resonator filter is isolated from a substrate using a bragg reflector. Materials having great difference in elastic impedance are alternately stacked to form the bragg reflector. Thus, a bulk acoustic wave (BAW) having passed through a piezoelectric layer inside the coupled resonator filter is not transmitted toward the substrate but reflected by the bragg reflector so as to produce an efficient resonance.

According to U.S. Pat. No. 6,670,866, it is difficult to fabricate the bragg reflector formed of four or more layers having uniform thicknesses. As a result, time and cost for fabricating the coupled resonator filter are increased.

SUMMARY OF THE INVENTION

Accordingly, the present general inventive concept has been made to address the above-mentioned problems, and an aspect of the present general inventive concept is to provide a method of sequentially stacking and patterning a plurality of layers and forming an air gap using backside etching so as to form a coupled resonator filter and a coupled resonator filter formed using the method.

According to an aspect of the present invention, there is provided a method of fabricating a coupled resonator filter, including: sequentially stacking a first electrode, a first piezoelectric layer, a second electrode, an insulating layer, a third electrode, a second piezoelectric layer, and a fourth electrode on a surface of a substrate; sequentially patterning the fourth electrode, the second piezoelectric layer, the third electrode, the insulating layer, the second electrode, the first piezoelectric layer, and the first electrode to expose first predetermined areas of the first, second, and third electrodes; forming a plurality of connection electrodes respectively connected to the first predetermined areas of the first, second, and third electrodes and a second predetermined area of the fourth electrode; and etching a third predetermined area of the substrate underneath the first electrode to form an air gap.

The forming of the plurality of connection electrodes respectively connected to the first predetermined areas of the first, second, and third electrodes and the second predetermined area of the fourth electrode may include: stacking a sacrificial layer on the exposed area of the first, second, and third electrodes and a whole surface of the fourth electrode; forming a plurality of viaholes in areas of the sacrificial layer corresponding to the first predetermined areas of the first, second, and third electrodes and the second predetermined area of the fourth electrode; injecting a conductive material into the plurality of via holes to form a plurality of connection electrodes; and removing the sacrificial layer.

The fourth electrode, the second piezoelectric layer, the third electrode, the insulating layer, the second electrode, the first piezoelectric layer, and the first electrode may be sequentially patterned so that areas of the first electrode, the first piezoelectric layer, the second electrode, the insulating layer, the third electrode, the second piezoelectric layer, and the fourth electrode are sequentially reduced.

One or more of the first piezoelectric layer, the insulating layer, and the second piezoelectric layer may be additionally exposed.

The etching of the third predetermined area of the substrate underneath the first electrode to form the air gap may include: forming a viahole in a lower surface of the substrate; injecting an etching material through the viahole to etch the third predetermined area of the substrate underneath the first electrode; and combining a lower packaging substrate with the lower surface of the substrate to close the viahole.

According to another aspect of the present invention, there is provided a coupled resonator filter including: a substrate including a surface including a predetermined area etched to form a cavity; a first electrode contacting the surface of the substrate; a first piezoelectric layer stacked on the first electrode; a second electrode stacked on the first piezoelectric layer; an insulating layer stacked on the second electrode; a third electrode stacked on the insulating layer; a second piezoelectric layer stacked on the third electrode; a fourth electrode stacked on the second piezoelectric layer; and a plurality of connection electrodes respectively connected to the first through fourth electrodes.

The first piezoelectric layer may be stacked on the first electrode to expose a first predetermined area of the first electrode, the insulating layer may be stacked on the second electrode to expose a second predetermined area of the second electrode, and the second piezoelectric layer may be stacked on the third electrode to expose a third predetermined area of the third electrode.

A first connection electrode of the plurality of connection electrodes may be connected to the first predetermined area of the first electrode, a second connection electrode of the plurality of connection electrodes may be connected to the second predetermined area of the second electrode, a third connection electrode of the plurality of connection electrodes may be connected to the third predetermined area of the third electrode, and a fourth connection electrode of the plurality of connection electrodes may be connected to a fourth predetermined area of the fourth electrode.

Areas of the first electrode, the first piezoelectric layer, the second electrode, the insulating layer, the third electrode, the second piezoelectric layer, and the fourth electrode may be sequentially reduced.

The coupled resonator filter may further include: an input node connected to the fourth connection electrode; a ground node connected to the third connection electrode; a first output node connected to the second connection electrode; and a second output node connected to the first connection electrode.

The coupled resonator filter may further include: a viahole connecting a lower surface of the substrate to the cavity; and a lower packaging substrate bonded to the lower surface of the substrate to close the viahole.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1:
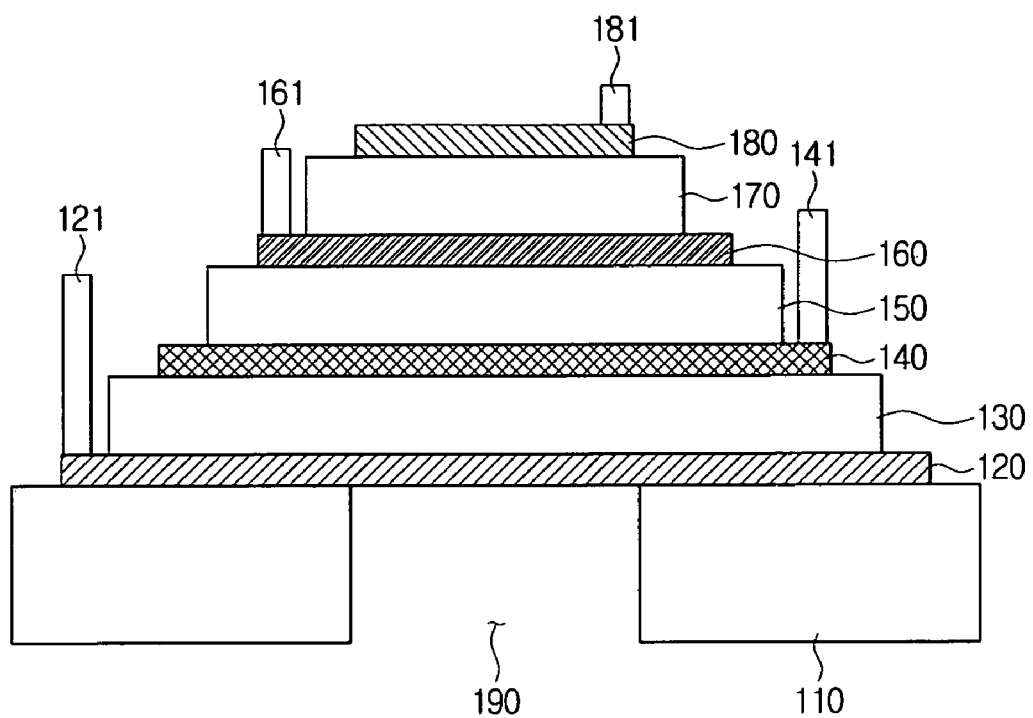
FIG. 1 is a vertical cross-sectional view of a coupled resonator filter according to an exemplary embodiment of the present invention.

Certain exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

According to an exemplary embodiment of the present invention, two FBARs are vertically stacked on a surface of a substrate, and a lower surface of the substrate is etched to form an air gap so as to fabricate a coupled resonator filter. Each of the two FBARs is fabricated in a sandwich structure in which a metal, a piezoelectric material, and a metal are sequentially stacked, and an insulating material is positioned between the two FBARs.

FIG. 1 is a vertical cross-sectional view of a coupled resonator filter according to an exemplary embodiment of the present invention. Referring to FIG. 1, the coupled resonator filter includes a substrate 110, a first electrode 120, a first piezoelectric layer 130, a second electrode 140, an insulating layer 150, a third electrode 160, a second piezoelectric layer 170, a fourth electrode 180, and an air gap 190.

The first electrode 120, the first piezoelectric layer 130, the second electrode 140, the insulating layer 150, the third electrode 160, the second piezoelectric layer 170, and the fourth electrode 180 are sequentially stacked on the substrate 110. The first electrode 120, the first piezoelectric layer 130, and the second electrode 140 constitute a FBAR, and the third electrode 160, the second piezoelectric layer 170, and the fourth electrode 180 constitute another FBAR. The insulating layer 150 insulates the two FBARs from each other and delays phases of the two FBARs.

First, second, third, and fourth connection electrodes 121, 141, 161, and 181 are respectively connected to the first, second, third, and fourth electrodes 120, 140, 160, and 180. The first, second, third, and fourth connection electrodes 121, 141, 161, and 181 are connected to an external power source to apply an electric current to the two FBARs.

An area of the substrate 110 underneath the first electrode 120 is etched to form the air gap 190. Thus, bulk acoustic waves generated by the two FBARs are reflected by the air gap 190.

The first, second, third, and fourth connection electrodes 121, 141, 161, and 181 are respectively connected to exposed areas of the first, second, third, and fourth electrodes 120, 140, 160, and 180. Referring to FIG. 1, the first connection electrode 121 connected to the first electrode 120 and the third connection electrode 161 connected to the third electrode 160 are formed at one side of a position in which the air gap 190 is formed, and the second connection electrode 141 connected to the second electrode 140 and the fourth connection electrode 181 connected to the fourth electrode 180 are formed at the other side of the position. However, the positions in which the first, second, third, and fourth connection electrodes 121, 141, 161, and 181 are to be formed may vary.

If a structure in which the two FBARs are vertically stacked as shown in FIG. 1 is fabricated, a transformation between an unbalanced signal and a balanced signal is performed. In more detail, if the fourth electrode 180 is connected to a signal power and the third electrode 160 is connected to a ground power, the second and first electrodes 140 and 120 operate as output nodes. Thus, if an unbalanced input signal is input through the fourth electrode 180, a balanced output signal is output through the second and first electrodes 140 and 120. This is described in U.S. Pat. No. 6,670,866 and other known techniques and thus will not be described in detail herein.

Figure 2A:
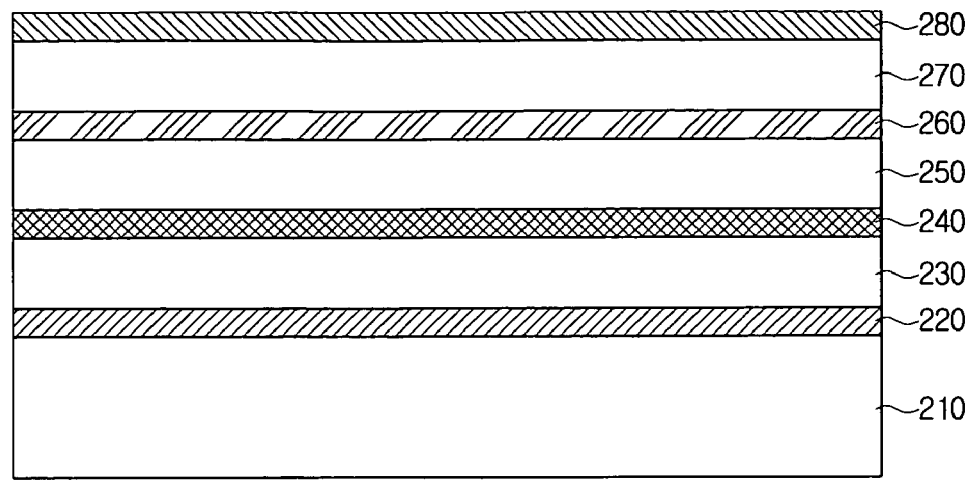
FIGS. 2A through 2F are vertical cross-sectional views illustrating a method of fabricating a coupled resonator filter according to an exemplary embodiment of the present invention.

FIGS. 2A through 2F are vertical cross-sectional views illustrating a method of fabricating a coupled resonator filter according to an exemplary embodiment of the present invention. Referring to FIG. 2A, a plurality of layers are sequentially stacked on a substrate 210. In detail, a first electrode 220, a first piezoelectric layer 230, a second electrode 240, an insulating layer 250, a third electrode 260, a second piezoelectric layer 270, and a fourth electrode 280 are sequentially stacked.

The first, second, third, and fourth electrodes 220, 240, 260, and 280 may be formed of a conductive material such as Al, W, Au, Pt, Ni, Ti, Cr, Pd, or Mo. The first piezoelectric layer 230 transforms an electric field into mechanical energy in an acoustic wave form to produce a piezoelectric phenomenon and may be formed of AlN or ZnO.

Figure 2B:
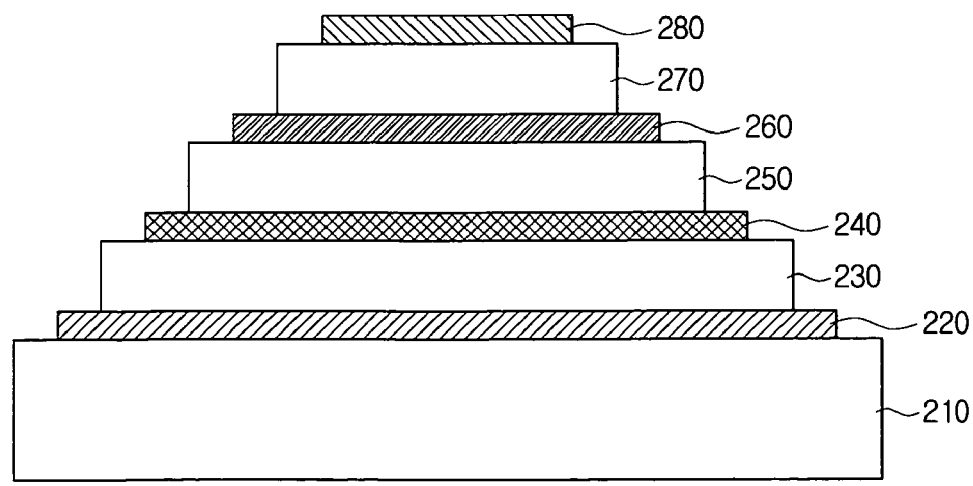

As shown in FIG. 2B, the first, second, third, and fourth electrodes 220, 240, 260, and 280 are sequentially patterned starting from an uppermost layer, i.e., the fourth electrode 280. Thus, areas of the first electrode 220, the first piezoelectric layer 230, the second electrode 240, the insulating layer 250, the third electrode 260, and the second piezoelectric layer 270 are exposed. In this case, edge areas of the first electrode 220, the first piezoelectric layer 230, the second electrode 240, the insulating layer 250, the third electrode 260, and the second piezoelectric layer 270 may be exposed.

As shown in FIGS. 2A and 2B, all the respective layers can be stacked first and then patterned to simplify a whole process and to prevent impurities from penetrating into interfaces among the respective layers so as to prevent a performance of the coupled resonator filter from being deteriorated. In other words, if patterning is performed whenever a respective layer is stacked, a process of stacking, etching, and planarizing a patterning mask must be performed for the respective layer. Impurities may remain on the interfaces among the respective layers in this individual process. However, according to the exemplary embodiment of the present invention, the respective layers may be sequentially stacked first and then patterned so as to prevent these problems.

Figure 2C:
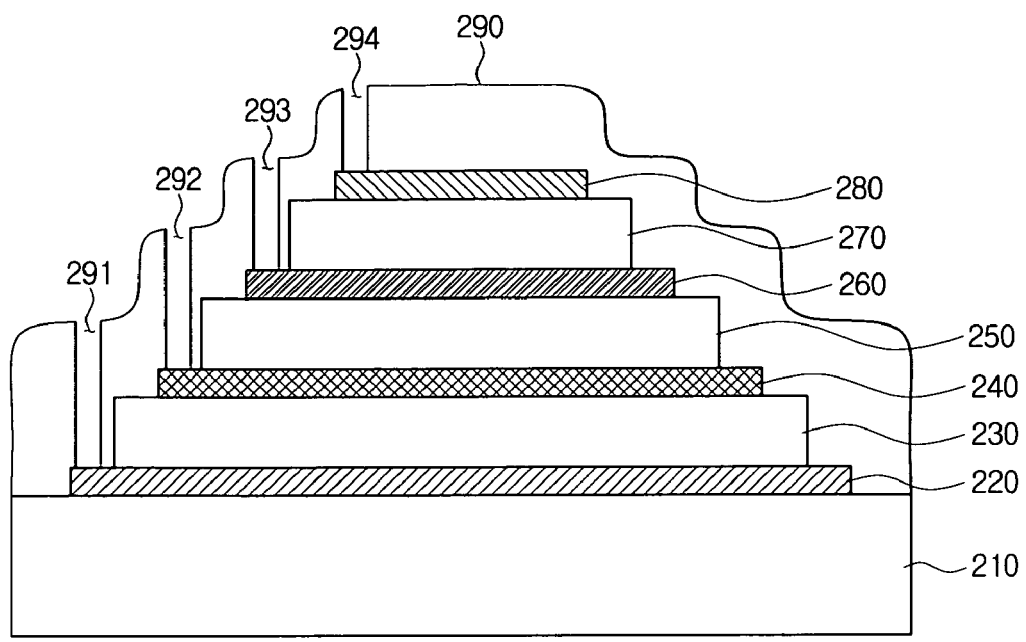

As shown in FIG. 2C, a sacrificial layer 290 is stacked on front surfaces of the first electrode 220, the first piezoelectric layer 230, the second electrode 240, the insulating layer 250, the third electrode 260, the second piezoelectric layer 270, and the fourth electrode 280 stacked on the substrate 210. The sacrificial layer 290 may be formed of a material that can be easily etched such as a general photoresist, poly silicon, MgO, or ZnO. If the sacrificial layer 290 is stacked, areas of the sacrificial layer 290 corresponding to positions in which first through fourth connection electrodes are to be formed are etched to form first through fourth viaholes 291 through 294. The first through fourth viaholes 291 through 294 are connected to the exposed areas of the first, second, and third electrodes 220, 240, and 260 and a predetermined area of the fourth electrode 280.

Figure 2D:
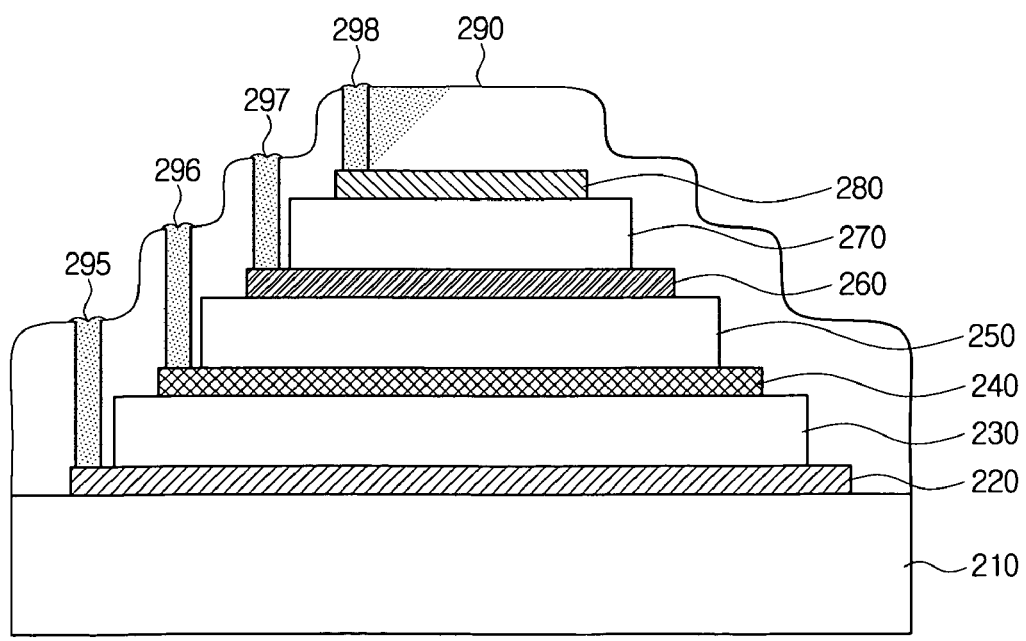

As shown in FIG. 2D, a conductive material is injected into the first through fourth viaholes 291 through 294 to form first through fourth connection electrodes 295 through 298. A plating process may be used in this process.

Figure 2E:
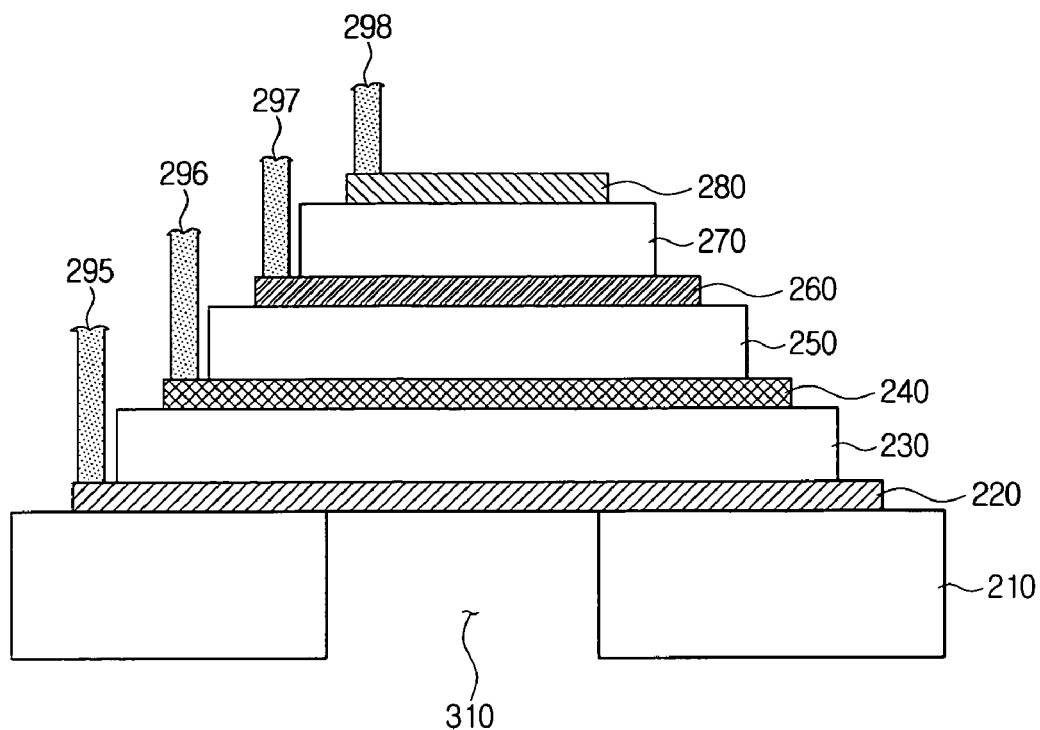

As shown in FIG. 2E, the sacrificial layer 290 is removed and a lower surface of the substrate 210 is etched to form an air gap 310. In this case, the air gap 310 may be formed using a bulk micromachining process. Thus, processes of stacking a sacrificial layer, performing chemical mechanical polishing, and etching the sacrificial layer do not need to be additionally performed.

Figure 2F:
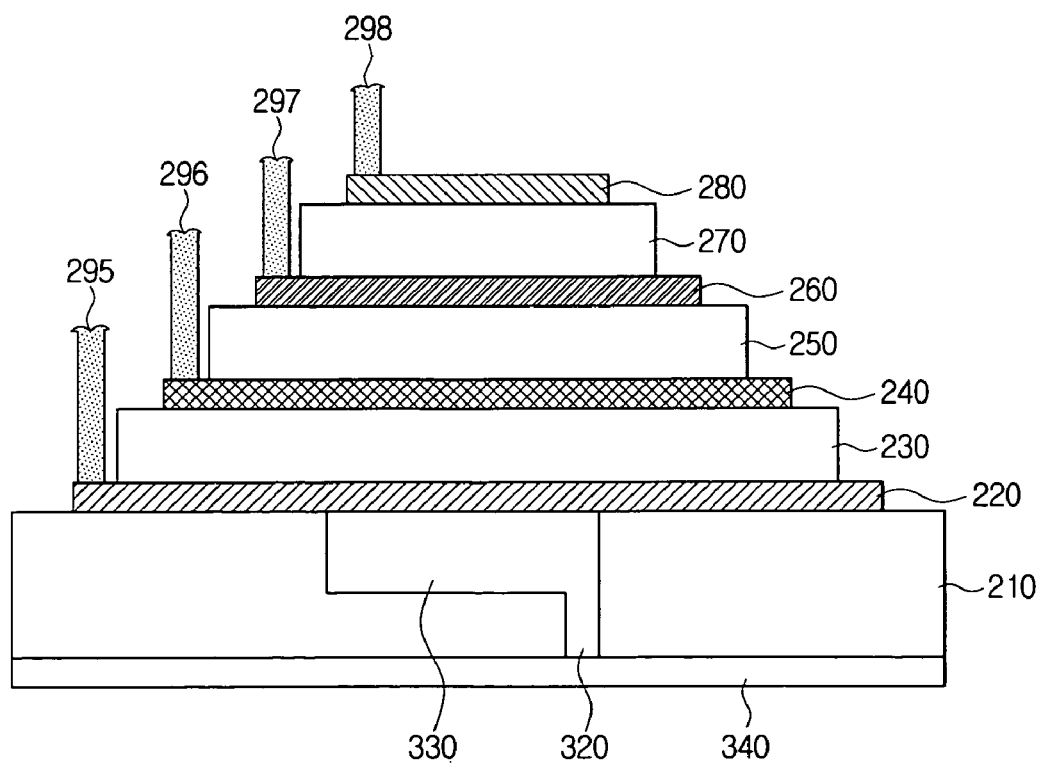

As shown in FIG. 2F, a viahole 320 is formed in the lower surface of the substrate 210, and an etching gas or an etchant is injected into the viahole 320 so as to form an air gap 330. In this case, a lower packaging substrate 340 may be additionally bonded to the lower surface of the substrate 210 so as to prevent foreign elements from penetrating into the air gap 330. In a case where the air gap 310 is formed in the structure shown in FIG. 2E, the lower packaging substrate 340 may be bonded.

Figure 3:
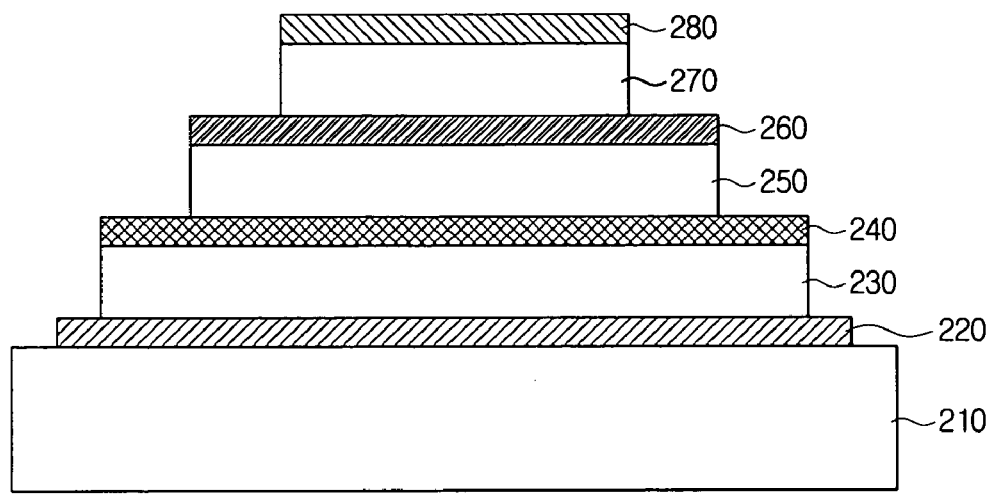
FIG. 3 is a vertical cross-sectional view illustrating a process of a method of fabricating a coupled resonator filter according to another exemplary embodiment of the present invention.

FIG. 3 is a vertical cross-sectional view illustrating a process of sequentially patterning the first electrode 220, the first piezoelectric layer 230, the second electrode 240, the insulating layer 250, the third electrode 260, the second piezoelectric layer 270, and the fourth electrode 280 that are sequentially stacked without exposing the first piezoelectric layer 230, the insulating layer 250, and the second piezoelectric layer 270 according to an exemplary embodiment of the present invention. As shown in FIG. 3, sizes, positions, shapes, and the like of exposed areas of the first electrode 220, the first piezoelectric layer 230, the second electrode 240, the insulating layer 250, the third electrode 260, the second piezoelectric layer 270, and the fourth electrode 280 may be adjusted by a fabricator.

Figure 4:
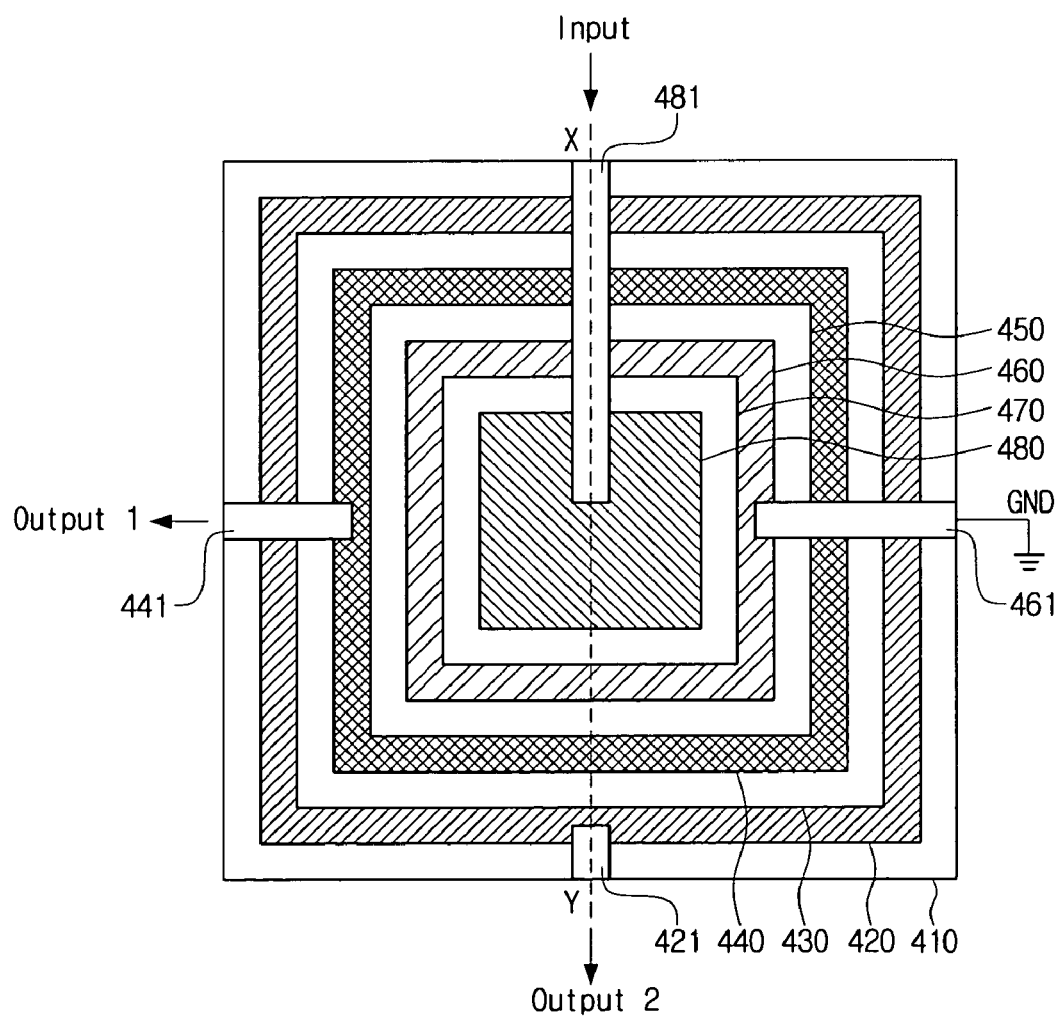
FIG. 4 is a horizontal cross-sectional view of a coupled resonator filter according to another exemplary embodiment of the present invention.

FIG. 4 is a horizontal cross-sectional view of a coupled resonator filter according to another exemplary embodiment of the present invention. Referring to FIG. 4, the coupled resonator filter is formed in a structure in which a substrate 410, a first electrode 420, a first piezoelectric layer 430, a second electrode 440, an insulating layer 450, a third electrode 460, a second piezoelectric layer 470, and a fourth electrode 480 are sequentially stacked. An air gap (not shown) is formed underneath the first electrode 420. The first, second, third, and fourth electrodes 420, 440, 460, and 480 are respectively connected to an input node 481, a ground node 461, a first output node 441, and a second output node 421 through first through fourth connection electrodes (not shown). Here, areas of the first electrode 420, the first piezoelectric layer 430, the second electrode 440, the insulating layer 450, the third electrode 460, the second piezoelectric layer 470, and the fourth electrode 480 are gradually reduced from a lowermost layer toward an upper most layer.

As shown in FIG. 4, the coupled resonator filer is formed in a square shape, and the input node 481, the ground node 461, the first output node 441, and the second output node 421 are respectively formed on each side of the square. Thus, if an unbalanced input signal is input through the input node 481, a balanced output signal is output through the first and second output nodes 441 and 421.

Figure 5:
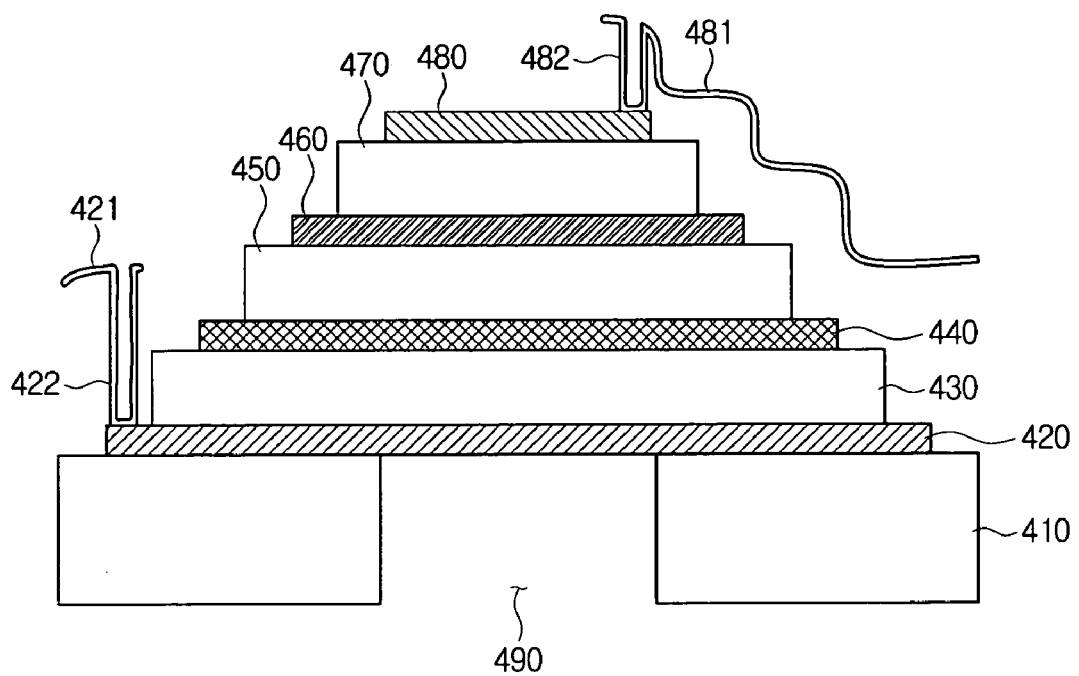
FIG. 5 is a vertical cross-sectional view of the coupled resonator filter shown in FIG. 4.

FIG. 5 is a vertical cross-sectional view of the coupled resonator filer of FIG. 4 on X-Y plane. Referring to FIG. 5, the areas of the first electrode 420, the first piezoelectric layer 430, the second electrode 440, the insulating layer 450, the third electrode 460, the second piezoelectric layer 470, and the fourth electrode 480 are gradually reduced toward a direction along which the first electrode 420, the first piezoelectric layer 430, the second electrode 440, the insulating layer 450, the third electrode 460, the second piezoelectric layer 470, and the fourth electrode 480 are distant from the substrate 410. Thus, edge portions of the first electrode 420, the first piezoelectric layer 430, the second electrode 440, the insulating layer 450, the third electrode 460, the second piezoelectric layer 470, and the fourth electrode 480 are exposed. Also, central portions of the first electrode 420, the first piezoelectric layer 430, the second electrode 440, the insulating layer 450, the third electrode 460, the second piezoelectric layer 470, and the fourth electrode 480 are aligned above an air gap 490.

Connection electrodes are connected to the exposed areas of the first electrode 420, the second electrode 440, the third electrode 460, and the fourth electrode 480. FIG. 5 is a cross-sectional view taken along the X-Y plane. Thus, only a first connection electrode 422 and a fourth connection electrode 482 are shown. The first and fourth connection electrodes 422 and 482 are respectively connected to the second output node 421 and the input node 481.

The coupled resonator filter having the structure shown in FIGS. 4 and 5 may be fabricated using the fabricating method described with reference to FIGS. 2A and 2F.

As described above, according to the exemplary embodiments of the present invention, a coupled resonator filter capable of performing a transformation operation between an unbalanced signal and a balanced signal can be fabricated using a simple process without a plurality of resonators and a balun structure. Also, a possibility of impurities penetrating into interfaces among layers can be reduced so as to improve a performance of the coupled resonator filter.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A method of fabricating a coupled resonator filter, comprising:
    sequentially stacking a first electrode, a first piezoelectric layer, a second electrode, an insulating layer, a third electrode, a second piezoelectric layer, and a fourth electrode on a surface of a substrate;
    sequentially patterning the fourth electrode, the second piezoelectric layer, the third electrode, the insulating layer, the second electrode, the first piezoelectric layer, and the first electrode to expose first predetermined areas of the first, second, and third electrodes;
    forming a plurality of connection electrodes respectively connected to the first predetermined areas of the first, second, and third electrodes and a second predetermined area of the fourth electrode; and
    etching a third predetermined area of the substrate underneath the first electrode to form an air gap.

2. The method of claim 1, wherein the first predetermined areas are positioned on edges of the first, second, and third electrodes.

3. The method of claim 1, wherein the forming of the plurality of connection electrodes respectively connected to the first predetermined areas of the first, second, and third electrodes and the second predetermined area of the fourth electrode comprises:
    stacking a sacrificial layer on the exposed area of the first, second, and third electrodes and a whole surface of the fourth electrode;
    forming a plurality of viaholes in areas of the sacrificial layer corresponding to the first predetermined areas of the first, second, and third electrodes and the second predetermined area of the fourth electrode;
    injecting a conductive material into the plurality of viaholes to form the plurality of connection electrodes; and
    removing the sacrificial layer.

4. The method of claim 1, wherein the fourth electrode, the second piezoelectric layer, the third electrode, the insulating layer, the second electrode, the first piezoelectric layer, and the first electrode are sequentially patterned so that areas of the first electrode, the first piezoelectric layer, the second electrode, the insulating layer, the third electrode, the second piezoelectric layer, and the fourth electrode are sequentially reduced.

5. The method of claim 1, wherein at least one of the first piezoelectric layer, the insulating layer, and the second piezoelectric layer is additionally exposed.

6. The method of claim 1, wherein the etching of the third predetermined area of the substrate underneath the first electrode to form the air gap comprises:
    forming a viahole in a lower surface of the substrate;
    injecting an etching material through the viahole to etch the third predetermined area of the substrate underneath the first electrode; and
    combining a lower packaging substrate with the lower surface of the substrate to close the viahole.

7. A coupled resonator filter the coupled resonator filter comprising:
    a substrate comprising a surface comprising a predetermined area etched to form a cavity;
    a first electrode contacting the surface of the substrate;
    a first piezoelectric layer stacked on the first electrode;
    a second electrode stacked on the first piezoelectric layer;
    an insulating layer stacked on the second electrode;
    a third electrode stacked on the insulating layer;
    a second piezoelectric layer stacked on the third electrode;
    a fourth electrode stacked on the second piezoelectric layer;
    a plurality of connection electrodes respectively connected to the first through fourth electrodes;
    a viahole connecting a lower surface of the substrate to the cavity; and
    a lower packaging substrate bonded to the lower surface of the substrate to close the viahole.

8. The coupled resonator filter of claim 7, wherein the first piezoelectric layer is stacked on the first electrode to expose a first predetermined area of the first electrode, the insulating layer is stacked on the second electrode to expose a second predetermined area of the second electrode, and the second piezoelectric layer is stacked on the third electrode to expose a third predetermined area of the third electrode.

9. The coupled resonator filter of claim 8, wherein a first connection electrode of the plurality of connection electrodes is connected to the first predetermined area of the first electrode, a second connection electrode of the plurality of connection electrodes is connected to the second predetermined area of the second electrode, a third connection electrode of the plurality of connection electrodes is connected to the third predetermined area of the third electrode, and a fourth connection electrode of the plurality of connection electrodes is connected to a fourth predetermined area of the fourth electrode.

10. The coupled resonator filter of claim 9, wherein the first, second and third predetermined areas are positioned on an edge of the first, second and third electrodes, respectively.

11. The coupled resonator filter of claim 10, wherein the first and third connection electrodes are formed on an opposite side of a position of the second and fourth electrode.

12. The coupled resonator filter of claim 9, wherein areas of the first electrode, the first piezoelectric layer, the second electrode, the insulating layer, the third electrode, the second piezoelectric layer, and the fourth electrode are sequentially reduced.

13. The coupled resonator filter of claim 9, further comprising:
    an input node connected to the fourth connection electrode;
    a ground node connected to the third connection electrode;
    a first output node connected to the second connection electrode; and
    a second output node connected to the first connection electrode.

14. The coupled resonator filter of claim 13,
wherein a plan-view shape of the coupled resonator filter is a square shape, and
wherein the input node, the ground node, the first output node, and the second output node are formed on each side of the square when viewed from the above.

15. The coupled resonator filter of claim 14, wherein the input node is positioned on an opposite side of a position of the second output node, and the ground node is positioned on an opposite side of a position of the first output node.

16. The coupled resonator filter of claim 13, wherein, if an unbalanced input signal is input through the input node, a balanced output signal is output through the first and second output nodes.

* * * * *